United States Patent
Gagey

(10) Patent No.: US 10,298,278 B2
(45) Date of Patent: May 21, 2019

(54) DELAY CIRCUIT FOR A RADIO SIGNAL WITH FILTER CIRCUITRY TO LINEARIZE A PHASE SHIFT OF AN OUTPUT SIGNAL RELATIVE TO AN INPUT

(71) Applicant: AIRBUS DS SLC, Elancourt (FR)

(72) Inventor: Olivier Gagey, Paris (FR)

(73) Assignee: AIRBUS DS SLC, Elancourt (FR)

( * ) Notice: Subject to any disclaimer, the term of this patent is extended or adjusted under 35 U.S.C. 154(b) by 0 days.

(21) Appl. No.: 15/613,959

(22) Filed: Jun. 5, 2017

(65) Prior Publication Data

US 2017/0353203 A1 Dec. 7, 2017

(30) Foreign Application Priority Data

Jun. 6, 2016 (FR) ...................................... 16 55129

(51) Int. Cl.
*H04B 1/40* (2015.01)
*H04B 1/12* (2006.01)
(Continued)

(52) U.S. Cl.
CPC ............. *H04B 1/1036* (2013.01); *H03H 7/19* (2013.01); *H03H 7/325* (2013.01); *H04B 1/12* (2013.01);
(Continued)

(58) Field of Classification Search
CPC .. H03H 7/19; H03H 7/32; H03H 7/30; H03H 7/34; H03H 7/325; H03H 7/345;
(Continued)

(56) References Cited

U.S. PATENT DOCUMENTS

| 4,885,562 A | * | 12/1989 | Ouvrard | ................... H03H 7/32 333/139 |
| 2004/0146237 A1 | | 7/2004 | Taylor et al. | |

(Continued)

FOREIGN PATENT DOCUMENTS

DE 34 01 994 A1 7/1985

OTHER PUBLICATIONS

Preliminary Search Report as issued in French Patent Application No. 1655129, dated Feb. 10, 2017.

*Primary Examiner* — Philip Sobutka
(74) *Attorney, Agent, or Firm* — Pillsbury Winthrop Shaw Pittman LLP

(57) ABSTRACT

A delay circuit for time offsetting an input radiofrequency signal, includes an all-pass filter having a given central frequency to linearize a phase-shift of an output signal relative to the input signal as a function of the frequency on a first frequency range; and first and second antiresonant circuits having respectively first and second central frequencies, the all-pass filter and the antiresonant circuits configured to linearize the phase-shift of the output signal relative to the input signal as a function of the frequency on a second frequency range including the first range. The difference between first and second central frequencies is less than 30% of the value of one of both frequencies, the difference between the first central frequency and the given central frequency of the all-pass filter is less than 30% of the value of a highest frequency between the first central frequency and the given central frequency.

13 Claims, 8 Drawing Sheets

(51) Int. Cl.

| | | |
|---|---|---|
| *H03H 7/19* | (2006.01) | |
| *H04B 1/10* | (2006.01) | |
| *H03H 7/32* | (2006.01) | |
| *H04B 1/525* | (2015.01) | |
| *H04B 3/23* | (2006.01) | |
| *H03H 7/20* | (2006.01) | |
| *H03H 7/25* | (2006.01) | |

(52) U.S. Cl.
CPC .............. *H04B 1/525* (2013.01); *H04B 3/232* (2013.01); *H03H 7/20* (2013.01); *H03H 7/255* (2013.01)

(58) Field of Classification Search
CPC ........ H04B 1/1036; H04B 1/12; H04B 1/525; H04B 15/00; H04B 1/0475; H04B 1/10; H04B 1/1018; H04B 1/16; H04B 1/7097; H04B 1/40
USPC ...... 455/78, 63.1, 296, 307, 306, 114.2, 283
See application file for complete search history.

(56) References Cited

U.S. PATENT DOCUMENTS

| | | |
|---|---|---|
| 2009/0061808 A1 | 3/2009 | Higgins |
| 2009/0227213 A1 | 9/2009 | Sadeghfam et al. |
| 2015/0130558 A1* | 5/2015 | Kawasaki .............. H03H 7/463 333/132 |

\* cited by examiner

DELAY CIRCUIT FOR A RADIO SIGNAL WITH FILTER CIRCUITRY TO LINEARIZE A PHASE SHIFT OF AN OUTPUT SIGNAL RELATIVE TO AN INPUT

CROSS-REFERENCE TO RELATED APPLICATIONS

This application claims priority to French patent application number 1655129 filed Jun. 6, 2016, the content of which is incorporated herein by reference in its entirety.

FIELD

The field of the invention relates to systems for transmitting and receiving radio communication waves. The invention is in particular concerned with interference processing between different radio communication systems located at a low distance from each other, as for example radio communication systems installed in a same vehicle and having their radio antennas on the roof of said vehicle.

STATE OF THE ART

Emergency or security services are led to use different pieces of radio communication equipment to meet their multiple communication needs. A vehicle can thus be equipped with a terminal such as a LTE terminal having radio communication channels having a wide frequency band and a high rate as well as a terminal such as a TETRAPOL terminal having radio communication channels having a narrow frequency band and a low rate. The transmission and reception antennas of the respective terminals, placed for example on the roof of a vehicle can thus exert a parasitic action onto each other.

Low rate communication systems being used are for example of the Tetrapol, Tetra or P25 type.

Higher rate communication systems being used are for example of the 4G or LTE type.

Two radio communication systems can thus interfere, which degrades communication quality and can even make communications impossible.

Interference naturally occurs even if transmission and reception are carried out on two different frequency bands. Indeed, the transmitted signal contains a wideband noise, this noise type being amplified by the non-linearities of the transmission chain. The wideband noise and the frequency band of the piece of receiver equipment therefore overlap each other on all or part of the bandwidth, which degrades the reception quality. Besides, the presence of a radio signal transmitted at a strong power at a low distance from a receiver can desensitise said receiver, even if the transmission and reception frequency bands are different.

Document US-2009/0061808 is known, which describes an adaptive system and method for cancelling a radiofrequency signal. This system type is however specifically set for an EMI (electromagnetic interference) scrambler fixedly implanted on an aircraft further equipped with a radiofrequency communication antenna. Likewise, document US-2009/0227213 describes an interference cancelling system between the transmitter and the receiver of an RFID system. This interference cancelling system comprises a device for sampling a part of the transmitted signal. This part of the transmitted signal, also called a "reference signal", is sent to a compensation circuit. This compensation circuit modifies the phase and amplitude of the reference signal. A device enables this phase and amplitude modified signal reference to be injected into the signal received by the receiver. The thus phase and amplitude modified reference signal injected in the signal received by the receiver is also called a "compensation signal". The receiver receives the sum of this signal transmitted by the transmitter and present at the receiver antenna, also called a "direct signal", and the compensation signal. By adjusting the amplitude of the compensation signal at the amplitude of the direct signal and by phase-shifting by 180° (modulo 360°) the phase of the compensation signal relative to the phase of the direct signal, the compensation signal cancels the direct signal. A difference in the time delays between the direct signal and the signal transmitted by the transmitter and between the compensation signal and the signal transmitted by the transmitter strongly degrades the performance of this device type. The cancellation of the direct signal by the compensation signal thus only intervenes in a reduced frequency range, making the device inefficient in cancelling the wideband noise transmitted by the transmitter or in cancelling in the entire transmission channel the signal transmitted from a high rate communication signal. Thus, if with this device, the compensation signal is perfectly amplitude and phase set relative to the direct signal to a central frequency, at 50 MHz from this central frequency, a difference of about 0.2 ns of time delay between the direct signal and the signal transmitted by the transmitter and between the compensation signal and the signal transmitted by the transmitter will limit the rejection of the direct signal to about 30 dB. It can be noted that this rejection limitation to about 30 dB is also reach for an amplitude difference between the compensation signal and the direct signal of about 0.27 dB, phase and delay being on the other hand perfectly adjusted.

Those skilled in the art further know the use of band-pass filters such as cavity filters used for transmission and reception. These filters represent however a high cost and their pass frequency and rejection bands are hardly modifiable in an operating mode.

There is thus a need for those skilled in the art to improve the interference attenuating systems.

SUMMARY OF THE INVENTION

To solve these problems, an object of the invention relates to a delay circuit for time offsetting an input radiofrequency signal. Said delay circuit comprises an all-pass filter having a given central frequency configured to linearize the phase-shift of the output signal relative to the input signal as a function of the frequency on a first frequency range and characterised in that it comprises a first antiresonant circuit having a first central frequency and a second antiresonant circuit having a second central frequency, the all-pass filter and the two antiresonant circuits being configured and arranged to linearize the phase-shift of the output signal relative to the input signal as a function of the frequency on a second frequency range including the first range.

To that end, the present invention describes in particular a device for physically removing interference which enables each of phase-shift, amplitude and time offset of the compensation signal to be adjusted. The possibility of adjusting the time offset in addition to the phase and amplitude of the compensation signal enables the interference to be efficiently removed on a wide frequency band.

To that end, the invention also relates to a delay circuit capable of providing a substantially constant delay on a frequency range widened relative to known delay circuits. Moreover, the delay circuit described by the present invention shows an improved delay stability as a function of the frequency relative to delay circuits known to those skilled in the art.

Such an improved delay circuit is thus a key element of the present invention.

By delay circuit, it is meant a circuit capable of outputting a signal Vout identical to the input signal Vin but with a time offset.

By all-pass filter, it is meant a delay circuit known to those skilled in the art, for example a circuit comprising a stopper circuit and a resonating circuit.

By central frequency of an all-pass circuit, it is meant the frequency in the middle of the frequency band on which the time offset between the signal at the input of the filter and the signal at the output of the filter is highest.

By antiresonant circuit, it is meant a circuit having a high impedance about its central frequency and low impedance away from its central frequency.

By central frequency of an antiresonant circuit, it is meant the frequency in the middle of the frequency band on which the circuit impedance is high.

Even if the all-pass filter makes a delay circuit per se, this circuit type includes drawbacks: the time offset being introduced is not constant as a function of the frequency of the transmitted signal. In other words, the curve illustrating the relationship between the introduced time offset and the frequency of the signal is not flat on the frequency range of interest.

This characteristic limits the use of an all-pass circuit in a device for physically removing interference between two radio communication systems when a wideband interference removal is desired.

The variation in the time offset with the frequency due to the fact that the phase-shift of the output signal Vout is linear as a function of the frequency only on a small frequency range about the central frequency of the all-pass circuit.

On the other hand, the introduction of two antiresonant circuits enable the phase-shift linearity of the output signal Vout to be better checked as a function of frequency. In particular, the linearity range between the phase-shift being introduced and the frequency is greater by virtue of the presence of both antiresonant filters.

In order to reduce interference on a receiver, the invention enables an improved delay circuit to be integrated into a device for physically removing interference for radio communication systems.

To that end, another object of the invention relates to an interference reducing device between a first piece of radio equipment including at least one transmitter and a second piece of radio equipment including at least one receiver, characterised in that said device comprises:
  a first coupler configured to sample a part of the signal transmitted by the first piece of radio equipment;
  a circuit for processing the sampled signal part delivering a modified signal, said processing circuit including a variable delay component comprising at least one delay circuit, introducing a time offset of the sampled signal;
  a second coupler configured to sum the modified signal to the signal received by the second piece of equipment.

By signal received by the second piece of equipment, it is meant the signal transmitted by the transmitter and present at the antenna of the receiver of the second piece of equipment.

By interference reducing device, it is meant a device which aims at reducing disturbances between both pieces of equipment. For example, a device which aims at attenuating a signal transmitted by the first piece of equipment in the signal received by the second piece of equipment.

In the following, such an interference device will be indifferently called an interference removing device or an interference removing device between a first piece of equipment and a second piece of equipment.

The compensation signal is added to the signal received by the second piece of equipment to cancel the signal transmitted by the first piece of equipment. For this, the amplitude of the compensation signal is adjusted at the amplitude of the received signal, the delay of the compensation signal with the transmitted signal is adjusted to be as close as possible to the delay between the received signal and the transmitted signal, the phase of the compensation signal is adjusted to be 180° (modulo 360°) at the phase of the received signal.

By circuit for processing the sampled signal part, it is meant the compensation circuit. Advantageously, the processing circuit or compensation circuit includes a delay circuit according to the invention. It enables the time offset of the signal to be very accurately checked on a widened frequency range.

This device is particularly adapted to the correction of interference on a wide frequency range.

The interference removing device according to the invention can also have one or more of the characteristics below, considered singly or according to any technically possible combinations:
  the first central frequency of the first antiresonant circuit and the second central frequency of the second antiresonant circuit differ by less than 30% of the value of one of both frequencies;
  the all-pass filter is a circuit comprising at least one stopper circuit formed by a first inductor associated in parallel with a first capacitor, a second capacitor, a third capacitor and a fourth capacitor, said stopper circuit having a cut-off frequency fa, the all-pass filter further comprising a resonant circuit formed by a fifth capacitor associated in series with a second inductor, said resonant circuit having a resonant frequency fb, the cut-off frequency fa and the resonant frequency fb differing by less than 20% of the value of one of both frequencies.
  the antiresonant circuits each comprise a capacitor associated in parallel with an inductor;
  the processing circuit comprises a variable phase-shifter modifying the phase of the sampled signal by the first coupler and a variable gain modifying the amplitude of the signal sampled by the first coupler;
  the interference removing device comprises a variable delay component including:
    a first circuit including at least one delay circuit according to the invention introducing a fixed delay;
    a second circuit arranged in series with the first circuit including at least one delay line according to the invention introducing a first stepped parameterisable delay; and
    a third circuit arranged in series with the first and second circuits introducing a second parameterisable delay continuously;
  the interference removing device comprises:
    a coupler configured to sample a part of the sum signal and transmit the rest of the sum signal to the second piece of equipment;

by sum signal it is meant the signal received by the second piece of equipment and the compensation signal.
a piece of equipment for characterising the sum signal;
a piece of control equipment configured to receive the signal from the piece of equipment for characterising the sum signal and to heck the pieces of equipment for modifying the properties of the sampled signal;
the first piece of radio equipment and the second piece of radio equipment are the same piece of equipment;
the transmission antenna of the first piece of radio equipment is common with the reception antenna of the second piece of radio equipment;
the delay circuit is between the coupler for sampling the first piece of radio equipment and its transmission antenna and/or the delay circuit is between the reception antenna of the second piece of radio equipment and the coupler for injecting the compensation signal;
the couplers are radiofrequency couplers or asymmetric power dividers
the piece of control equipment contains a memory for recording parameters of the phase-shifter, the variable gain and the delay.
A learning sequence with a wideband transmitted signal enables the parameters of the phase-shifter, the variable gain and the delay to be adjusted at default values. These values could be used by the piece of control equipment as a starting point for setting the phase-shifter, the variable gain and the delay for future operational transmissions of the transmitter.
Another object of the invention is also a delay line for introducing a variable delay in an output signal, said delay line comprising a cascading of a plurality of delay circuits, each delay circuit:
introducing a given multiple of a base delay ($T_{base}$); and
being associated with a switch (RF switch) to activate or deactivate the delay circuit,
a delay parameterising component being configured to introduce a given delay by activating/deactivating a sub-assembly of the switches of the delay line.

LIST OF THE FIGURES

Further characteristics and advantages of the invention will better appear from the description thereof given below, by way of indicating and in no way limiting purposes, in reference to the appended figures in which.

DETAILED DESCRIPTION

Figure 1:
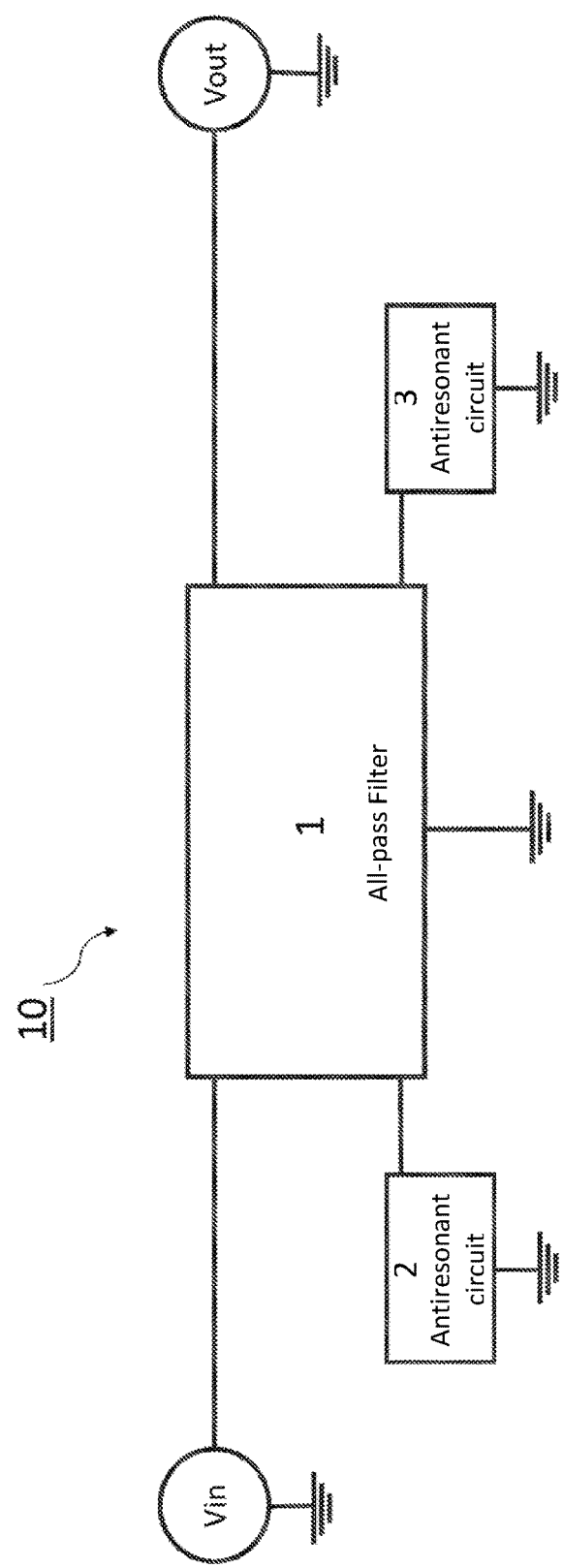
FIG. 1 illustrates the delay circuit according to the invention.

FIG. 1 illustrates the delay circuit 10 according to the invention. The circuit 10 is a circuit capable of outputting a signal Vout identical to the signal Vin but with a time offset.

The delay circuit 10 according to the invention is comprised of an all-pass filter 1 and two antiresonant circuits 2, 3. The all-pass filter 1 has a given central frequency $f_0$. The first and second antiresonant circuits 2 and 3 have the respective centre frequencies $f_1$ and $f_2$.

Figure 2B:
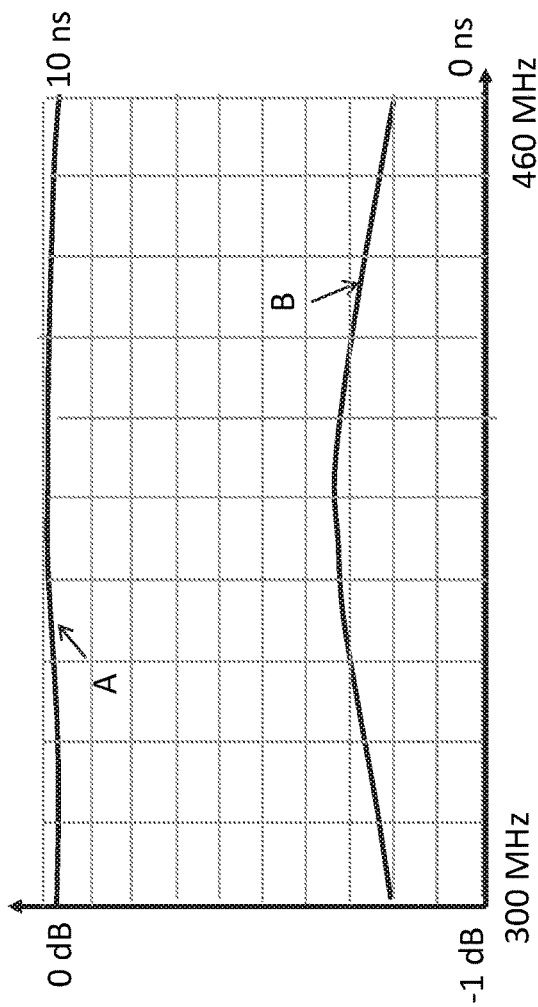
FIG. 2b shows the transmission and time delay introduced by the circuit of FIG. 2a on a frequency range from 300 MHz to 460 MHz.
Figure 2A:
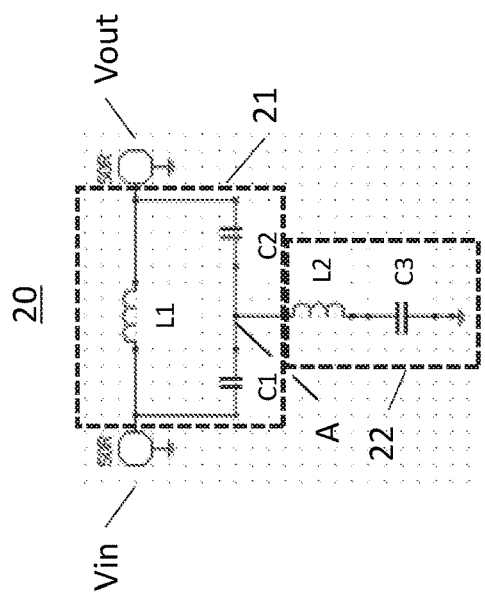
FIG. 2a illustrates an all-pass filter, used as a delay circuit in prior art.

An exemplary all-pass circuit 20 known to those skilled in the art is represented in FIG. 2a. This circuit comprises a stopper circuit 21 and a resonant circuit 22. FIG. 2b shows the characteristics of this filter on the frequency range between 300 MHz and 460 MHz.

A way to qualitatively understand the operation of the circuit 20 is the following one. The stopper circuit 21 formed by the capacitances C1 and C2 associated in parallel with an inductor (also called induction coil) L1 has a cut-off frequency fa. The resonant circuit 22 formed by the capacitance C3 associated in series with the induction coil L2 has a resonant frequency fb. The values of the components C1, C2, L1, C3, L2 are adjusted such that frequencies fa and fb are quasi identical. By fa and fb quasi identical, it is meant that fa and fb differ by less than 20%.

Away from frequencies fa and fb, the impedance of the resonant circuit 22 is high. The circuit 20 behaves as a stopper circuit away from its cut-off frequency: the transmission of the signal through this filter is very weakly attenuated with a low transmission delay. Close to frequencies fa and fb, the impedance of the resonant circuit 22 is low, point A of the circuit 20 is electrically connected to the ground, the circuit 20 can be assimilated to a delay line formed by a series induction coil L1 and two capacitances C1 and C2 connected to each end of the induction coil L1 and the ground, the delay line has a delay maximum at frequency fa.

FIG. 2b summarises the performance of the circuit 20 with the followings values for the components: C1=C2=15 pF, L1=22 nH, C3=10 pF, L2=22 nH. The values for the components are only given by way of illustrating purposes and other values are possible.

Curve A of FIG. 2b shows the transmission as a function of the frequency of the transmitted signal. By transmission, it is meant the amplitude of the output signal Vout at a given frequency divided by the amplitude of the input signal Vin at the same frequency. The transmission varies very slightly as a function of the frequency on the frequency range which is considered, hence the name of all-pass circuit.

Curve B of FIG. 2b represents the delay introduced by the circuit 20 as a function of the signal frequency. The delay introduced is about 3.3 ns in the middle of the frequency range. At 50 MHz on either side of the central frequency of the all-pass filter, the delay variation relative to the delay at the central frequency can reach 0.7 ns, whereas the transmission variation relative to the transmission at the central frequency only reaches 0.02 dB. The trade-off between stability as a function of the attenuation frequency and stability as a function of the delay frequency is thus very unbalanced, this structure type having an excellent amplitude stability as a function of the frequency and a poor delay stability as a function of the frequency. The frequency range B1 for which the phase-shift is linear or quasi linear as a function of the frequency, that is the delay is constant or quasi constant, is very limited.

These variations in the delay on the frequency range of interest do not enable the time offset of the compensation signal to be properly adjusted in a wideband interference physical removing device.

Figure 3B:
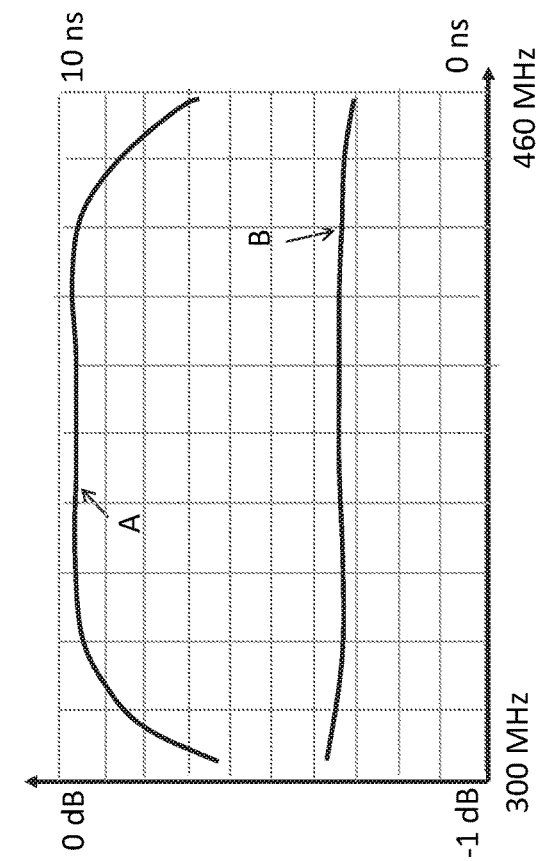
FIG. 3b shows the transmission and time offset introduced by the circuit of FIG. 3a on a frequency range from 300 MHz to 460 MHz.
Figure 3A:
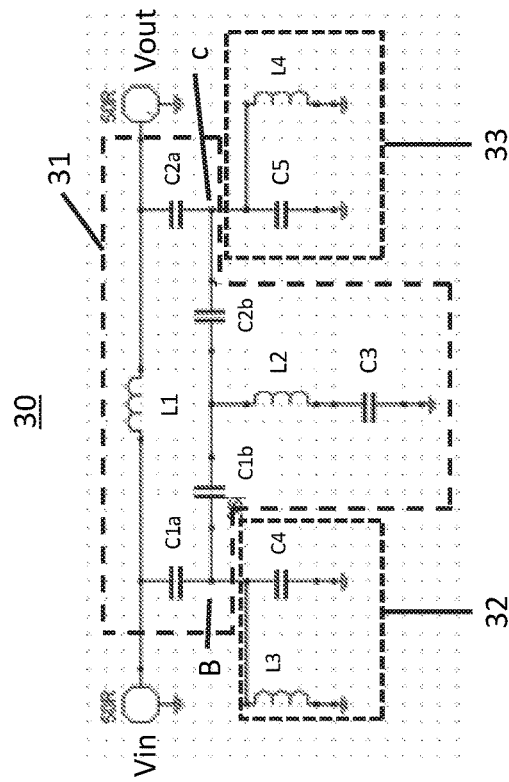
FIG. 3a illustrates an exemplary embodiment of the delay circuit according to the invention.

An exemplary embodiment of a delay circuit according to the invention is the circuit 30 of FIG. 3*a*.

The circuit 30 of FIG. 3*a* is an all-pass filter 31 associated with two antiresonant circuits 32 and 33 having centre frequencies $f_1$ and $f_2$. Both antiresonant circuits are integrated to the all-pass filter through two electrical connections.

According to one embodiment, the first antiresonant circuit 32 comprises a capacitor C4 associated in parallel with an induction coil L3.

According to one embodiment, the second antiresonant circuit 33 comprises a capacitor C5 associated in parallel with an induction coil L4.

According to one embodiment, the first couple of capacitors C1*a*, C1*b* including a first capacitor C1*a* and a second capacitor C1*b* is represented on the all-pass circuit. A first antiresonant circuit 32 is connected between the first C1*a* and the second C1*b* capacitor. A second couple of capacitors C2*a*, C2*b* including a third capacitor C2*a* and a fourth capacitor C2*b* is represented on the all-pass circuit 31. The second antiresonant circuit 33 is connected between the third C2 and the fourth C2*b* capacitor.

In this example, the first capacitor C1*a* and the third capacitor C2*a* have a capacitance of 27 pF, the second capacitor C1*b* and the fourth capacitor C2*b* have a capacitance of 36 pF.

The first C1*a*, C1*b* and the second C2*a*, C2*b* couple of capacitors of FIG. 3*a* provide two equivalent or quasi equivalent capacitances to the capacitances provided by the first C1 and the second C2 capacitor of FIG. 2*a*.

When the frequencies $f_1$ and $f_2$ are appropriately chosen with respect to the central frequency of the all-pass filter 31, the frequency range B2 for which the phase-shift is linear or quasi linear as a function of the frequency is broader than range B1. For this, the frequencies f1 and f2 are adjusted to create a second maximum in the curve representing the delay between the input and output of the circuit 30. This second maximum will enable the delay variation to be stabilised as a function of the frequency of the circuit 30.

A way to qualitatively understand the operation of the circuit 30 is the following one. The components C1*a*, C1*b*, C2*a*, C2*b*, L1, L2, C3 of the all-pass filter 31 are adjusted to set the all-pass filter as previously described. The components of the antiresonant circuits 32 and 33 are adjusted to have antiresonant frequencies $f_1$ and $f_2$ which are close to the central frequency $f_0$ of the all-pass filter 31. Away from this central frequency $f_0$ of the all-pass filter 31, the first antiresonant circuits have a low impedance, points B and C of the circuit 30 are electrically connected to the ground, the circuit 30 can be assimilated to a delay line formed by a series induction coil L1 and two capacitances C1*a* and C2*a* connected to each end of the induction coil L1 and to the ground, this delay line has a delay maximum at a frequency different from the central frequency of the all-pass filter 31, thus creating a second delay maximum in the curve representing the delay between the input and output of the circuit 30.

In other words, the circuit 10 or its particular embodiment 30 ensures linearity between the phase-shift dφ and the frequency ω on a broad frequency range B2 including range B1.

According to one embodiment, both antiresonant frequencies $f_1$ and $f_2$ are identical or quasi identical. By quasi identical, it is meant a difference between frequencies which is lower than 20% of the value of one of the frequencies.

According to one embodiment, the difference between frequencies fa and fb is lower than 20% of the value of the highest frequencies among fa and fb.

According to another embodiment, by de-symmetrising values C1*a* and C1*b* relative to C2*a* and C2*b*, the difference between frequencies f1 and f2 can be enhanced.

According to one embodiment, the difference between the central frequency $f_0$ of the all-pass circuit and the antiresonant frequency $f_1$ is lower than 30%. According to one embodiment, the difference between $f_0$ and $f_1$ is lower than 30% of the highest frequency value among $f_0$ and $f_1$.

No restriction exists on techniques for manufacturing the components of FIG. 3*a*. For example, the capacitors and induction coils can be gathered elements or components made with any other technique known to those skilled in the art (discrete components, MEMs, screen printed components, etc.).

FIG. 3*b* shows the performance of the circuit 30 with as values for the components: C1*a*=C2*a*=27 pF, C1*b*=C2*b*=36 pF, L1=22 nH, C3=10 pF, L2=22 nH, C4=C5=10 pF, L4=L3=16 nH. The component values are only given by way of illustrating purposes and other values are possible.

Curve A of FIG. 30 represents the transmission of the circuit 30 as a function of the frequency of the transmitted signal. By transmission, it is meant the amplitude of the signal Vout divided by the amplitude of the signal Vin at a given frequency. The transmission remains high on most of the frequency range of interest. At 50 MHz on either side of the central frequency of the all-pass filter, the transmission variation relative to the transmission at the central frequency reaches 0.03 dB.

Curve B of FIG. 3*b* represents the delay introduced by the circuit 30 as a function of the signal frequency. The time offset varies very slightly and the variation is reduced relative to the same curve represented in FIG. 2*b* in the case of circuit 20. At 50 MHz on either side of the central frequency of the all-pass filter, the delay variation relative to the delay of the central frequency of the all-pass filter only reaches 0.09 ns.

Advantageously, the circuit 10 enables a constant or quasi constant time offset to be obtained on a broad frequency range B2. The trade-off between stability as a function of the attenuation frequency and stability as a function of the delay frequency is thus better balanced.

The circuit 10 or the practical example of its implementation 30 can thus be used in all the applications for which the same time offset should be introduced in a wide frequency range.

Examples of such applications are circuits for physically removing interference in radio communication systems or even feed-forward type amplifiers.

According to a particular embodiment of the invention, frequency $f_1$ is equal to frequency $f_2$.

According to another embodiment of the invention, the all-pass filter 1 is a circuit comprising a stopper circuit 21 and a resonant circuit 22.

One advantage of this embodiment is to obtain the all-pass filter with a circuit which is relatively easy to make, with a low bulk and the properties of which are well known.

One embodiment of an all-pass circuit is illustrated in FIG. 2a. The latter is given by way of example and any other alternative embodiment is also possible for the purposes of the present invention.

According to one embodiment of the invention, the antiresonant circuits are made from a parallel LC circuit.

One advantage of this embodiment is to enable antiresonant circuits to be made in a simple, inexpensive manner with low bulks.

Figure 4:
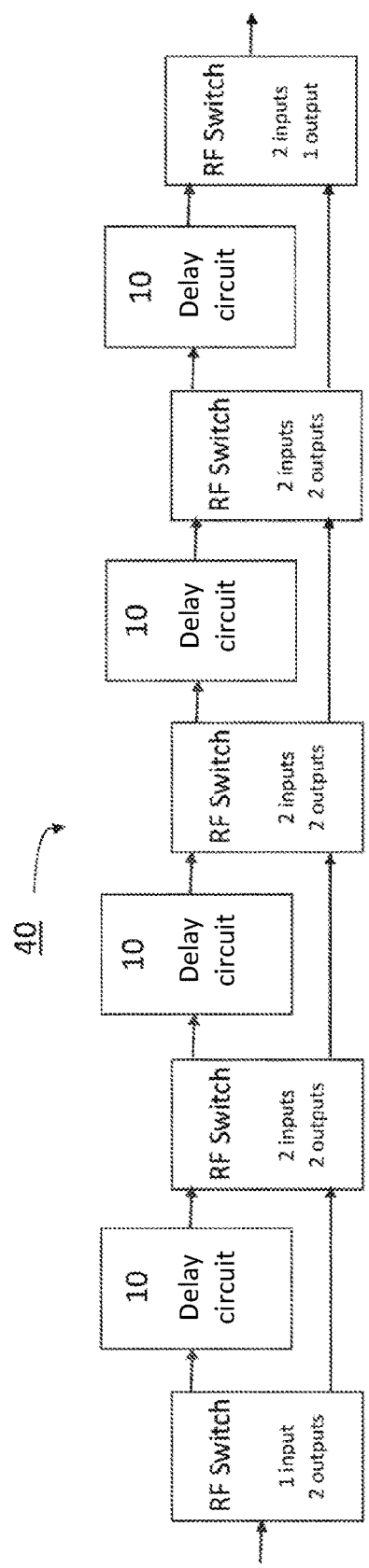
FIG. 4 shows a delay line obtained by combining several delay circuits and several radiofrequency switches.

Another aspect of the invention relates to a delay line or a step parameterisable delay circuit 40. Such a circuit is illustrated in FIG. 4.

The delay line 40 is obtained by connecting delay circuits 10 in cascade. RF switches are disposed between two successive delay circuits. This arrangement enables the number of delay circuits through which the signal to be offset passes to be selected, which enables the total time offset to be checked.

To achieve more flexibility, each of the delay circuits 10 inserted in the delay line can introduce a time offset which is a multiple of a base offset $T_{base}$. The time offset $T_{base}$ is determined by the values of the capacitances and induction coils chosen upon designing circuit 10 or circuit 30.

Each of the RF switches has at least two inputs and two outputs to be able either to send the signal to the successive delay circuit either to by-pass the successive delay circuit.

Advantageously, the delay line 40 thus comprises a delay parameterising component for activating/deactivating a sub-assembly of switches. This parameterising allows to select which time offset to introduce.

Advantageously, the first RF switch has at least one input to sample the signal to be time offset. The last RF switch has at least one output for transmitting the signal to which the delay line applies the time offset.

By virtue of the delay line 40, it is possible to modify the offset applied to an input signal while using delay circuits having a constant or quasi constant delay as a function of the frequency. It is in particular advantageous to use delay circuits 10 or 30 in the delay line 40.

Figure 5:
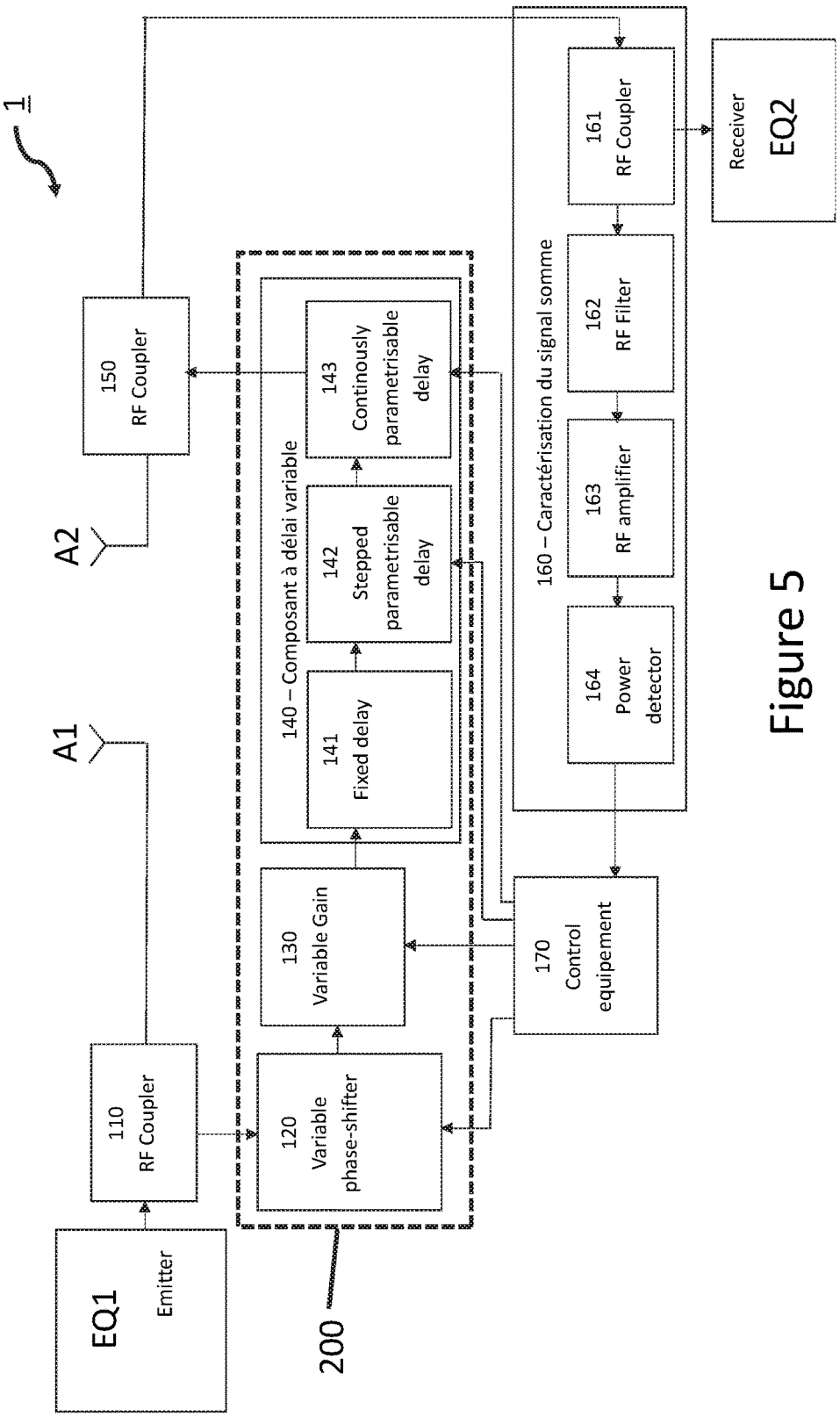
FIG. 5 illustrates the interference removing circuit.

Another aspect of the invention is a device 1 for physically removing interference between two radio communication systems, which is shown in FIG. 5.

Device 1 is an interference removing device between a first piece of radio equipment EQ1 including at least one transmitter and a second piece of radio equipment EQ2 including at least one receiver, said device 1 comprises:
  a first coupler 110 configured to sample a part of the signal transmitted by the first piece of radio equipment EQ1;
  a compensation signal 200 of the sampled signal part delivering a compensation signal, said processing circuit 200 including a variable delay component 140 comprising at least one delay circuit 10 according to the invention, introducing a time delay to the sampled signal.
  a second coupler 150 configured to sum the compensation signal to the signal received by the second piece of equipment EQ2.

Advantageously, the device 1 enables the phase, amplitude and time offset of the compensation signal to be modified before being summed to the signal received by the second piece of equipment EQ2.

Advantageously, the device 1 contemplates the use of the delay circuit 10, which enables a constant time offset as a function of the frequency to be introduced.

Pieces of equipment EQ1 and EQ2 comprise a radio module for transmission/reception, a cable for connecting the module to the antenna and a terminal for checking interaction with operators.

In the case of uses by security forces, the two pieces of equipment EQ1 and EQ2 can be placed in a same vehicle. The transmission/reception antennas can for example be placed on the roofs of the vehicles.

The radio modules of pieces of equipment EQ1 and EQ2 are connected to the antennas by cables which have a length in most cases between 2 and 5 m.

The distance between both antennas is in most cases between 1 and 3 m. A time offset in the order of a few tens of ns exists between the signal which travels directly from one antenna to the other and the compensation signal which travels through the cables.

This time offset is due to the distance difference travelled and to the propagation speed difference of the radio waves in different propagation means such air or cables. When an offset in the order of the few tens of ns exists, the device 1 according to the invention is particularly efficient in removing interference between EQ1 and EQ2.

Figure 6:
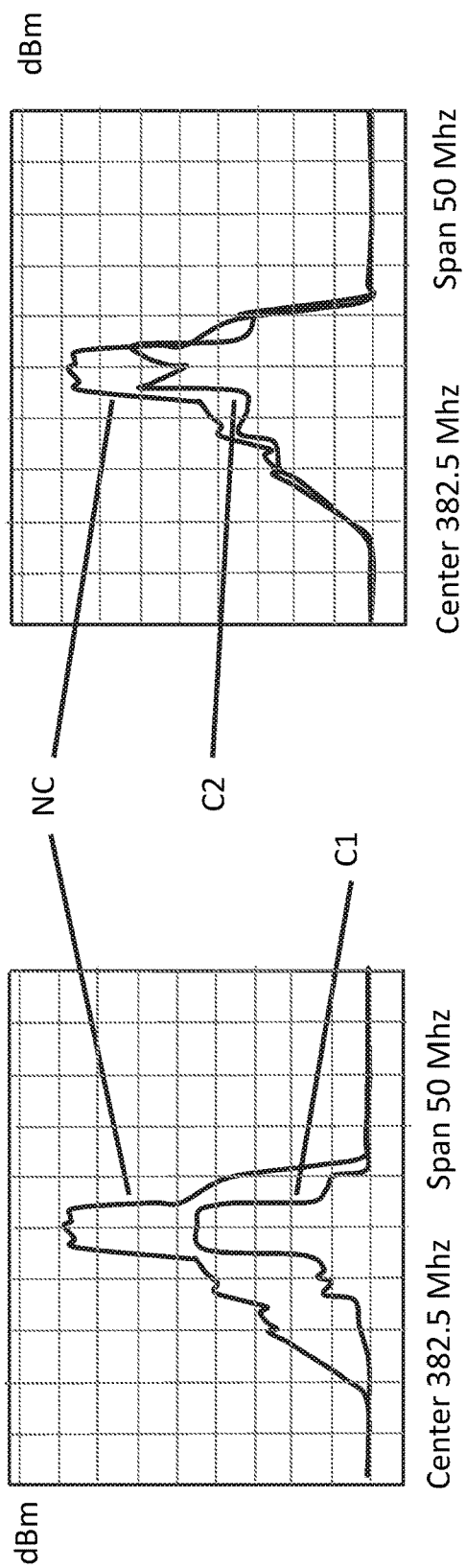
FIG. 6a shows the signal received by a piece of receiver equipment with and without removing the interference using the interference removing device according to the invention and a 1 ns delay difference between the received signal and the compensation signal.
FIG. 6b shows the signal received by a piece of receiver equipment with and without removing the interference using the interference removing device according to the invention, and a 15 ns delay difference between the received signal and the compensation signal.

One exemplary interference removal between a first piece of radio equipment EQ1 and a second piece of radio equipment EQ2 with the device 1 according to the invention is shown in FIG. 6a. In the case being considered, a 1 ns offset between the signal propagated in air and the signal propagated in the delay line exists.

Curve NC of FIG. 6a represents the signal received by piece of equipment EQ2 without compensating the part of device 1. Curve C1 represents the signal obtained at piece of equipment EQ2 after the compensation performed using device 1. It is obvious that the parasitic signal received by EQ2 after correction is lower throughout the range of frequencies received by EQ2.

On the contrary, when the compensation is performed using a device as that described in patent application US 2009/0227213 and known to those skilled in the art, the interference removal is only efficient on a narrow frequency range which is centred about the carrier (see valley on curve C2 of FIG. 6b).

The comparison between FIGS. 6a and 6b shows how important is the adjustment of the time offset in addition to the amplitude and phase of the compensation signal. The possibility of separately adjusting these three properties enables interference to be more efficiently removed relative to devices known to those skilled in the art.

The first and second pieces of radio equipment EQ1 and EQ2 can use low rate or high rate type communication protocols.

Examples of low rate communication systems traditionally used by the security forces are Tetrapol, Tetra, P25 or else.

Examples of high rate communication systems are the LTE/4G type wireless communication networks.

The device according to the invention turns out to be particularly advantageous when the piece of transmitter equipment EQ1 is a LTE/4G type piece of equipment. In this case, the piece of transmitter equipment has wideband radio communication channels and the efficient interference removal on a wide frequency range turns out to be critical.

According to one particular embodiment, the processing circuit or compensation circuit 200 comprises a variable phase-shifter 120 modifying the phase of the signal sampled from the first coupler 110 and a variable gain 130 modifying the amplitude of the signal sampled from the first coupler 110.

By variable gain 130, it is meant a device capable of increasing (positive gain) or decreasing (negative gain) the amplitude of the signal at the input thereof.

One advantage of this embodiment is to be able to set the amplitude and phase of the compensation signal in order to achieve interference removal between piece of equipment EQ1 and piece of equipment EQ2.

According to one embodiment, the variable phase-shifter 120 can be made with at least one 3 dB quadrature hybrid coupler associated with varicap diodes.

Figure 7:
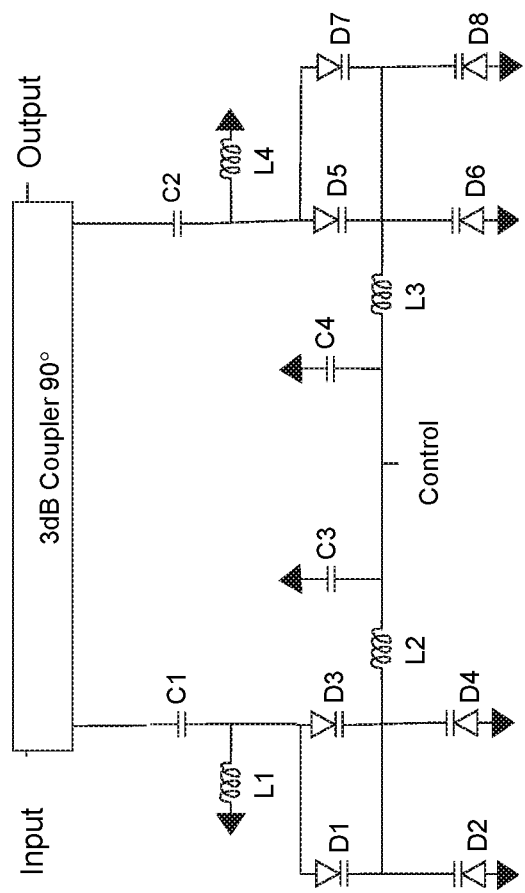
FIG. 7 shows an exemplary embodiment of variable phase-shifter.

In a known manner, several varicap diodes can be used to improve the linearity of the phase-shifter at RF powers. FIG. 7 shows an exemplary embodiment, D1 to D8 are varicap diodes, C1 to C4 are capacitances, L1 to L4 are induction coils.

Figure 8:
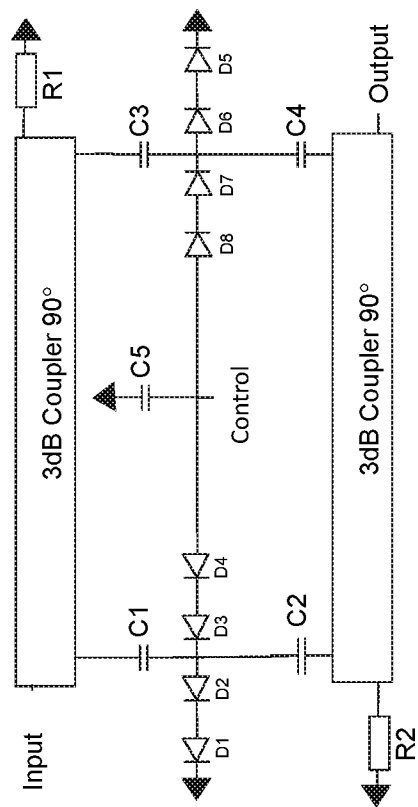
FIG. 8 shows an exemplary embodiment of a variable attenuator or a variable gain attenuator with a negative gain.

According to one embodiment, the variable gain can be made with at least one 3 dB quadrature hybrid coupler associated with PIN diodes. FIG. 8 shows an exemplary embodiment, D1 to D8 are PIN diodes, C1 to C5 are capacitances, R1 and R2 are resistors.

According to one particular embodiment, the device 1 comprises a variable delay component 140 including:
- a first circuit 141 including at least one delay circuit introducing a fixed delay 141;
- a second circuit 142 arranged in series with the first circuit 141 including at least one delay line according to the invention introducing a first stepped parameterisable delay; and
- a third circuit 143 arranged in series with the first and second circuits 141, 142 introducing a second parameterisable delay continuously.

Advantageously, the component 140 enables the time delay introduced by device 1 to be set.

Advantageously, the delay circuit 10 according to the invention can be used within circuits 141 and 142 to introduce the fixed time delay on a wide frequency range.

Circuit 142 introducing a first stepped parameterisable delay can be made with the delay line 40 of FIG. 5.

Circuit 143 introducing a second stepped parameterisable delay can be made with an inductor associated with varicap diodes.

According to one embodiment, the device 1 comprises:
- a coupler 161 configured to sample a part of the sum signal and transmit the rest of the sum signal to the second piece of equipment EQ2;
- a piece of equipment 160 for characterising the sum signal;
- a piece of control equipment 170 configured to receive the signal from piece of equipment 160 for characterising the sum signal and to control the pieces of equipment for modifying the properties of the sampled signal 120, 130, 140.

By sum signal, it is meant the combination of the compensation signal from the processing circuit 200 and of the signal received by the second piece of radio equipment EQ2.

According to one embodiment, device 160 is a piece of equipment for measuring the power of the carrier of the sum signal.

Advantageously, the piece of equipment for characterising the sum signal 160 enables the residual signal to be evaluated after subtracting the compensation signal. Ideally, the sum signal obtained as a combination of the compensation signal and the signal received at piece of equipment EQ2 is zero if the interference is perfectly removed.

The piece of equipment for characterising the sum signal 160 comprises at least one of the following elements: a coupler 161, an RF filter and a power detector. According to one embodiment, piece of equipment 160 can also comprise an RF amplifier.

The presence of an RF filter and an RF amplifier enables the power associated with the sum signal in the transmission frequency band of piece of equipment EQ1 to be more reliably measured.

Piece of equipment 160 thus plays the role of measuring the residual interference in the sum signal obtained as a combination of the compensation signal and the signal received by piece of equipment EQ2 and directly transmitted by EQ1.

The signal from piece of equipment 160 is sent to a piece of control equipment 170. Based on the received signal, piece of equipment 170 modifies the parameters of the compensation circuit to minimise the sum signal.

The piece of control equipment 170 includes for example an electronic memory to record the characteristics of the variable phase-shifter 120, the variable gain 130, the delay component 140. The characteristics of the delay component 140 are for example the characteristics of the fixed delay 141, the stepped parameterisable delay 142 and the parameterisable delay 143.

The piece of control equipment modifies the phase-shift, attenuation and time offset of the compensation signal to minimise the power of the sum signal measured by piece of equipment 160. The minimisation of the power measured by piece of equipment 160 is thus the criterion used to minimise interference between a first piece of equipment EQ1 and a second piece of equipment EQ2.

According to one embodiment, the first piece of equipment EQ1 and the second piece of equipment EQ2 are the same piece of equipment.

Because of the superimposition of the transmission and reception frequency ranges, the use of the device 1 according to the invention turns out to be particularly_advantageous when piece of equipment EQ1 and piece of equipment EQ2 are the same piece of equipment.

According to one embodiment, the first piece of equipment EQ1 and the second piece of equipment EQ2 use the same antenna.

The interference removal system according to the invention turns out to be particularly advantageous when both pieces of equipment EQ1 and EQ2 use the same antenna.

According to one embodiment, the variable delay component 140 is placed on the electrical connection connecting the first piece of equipment EQ1 to an antenna A1.

According to one embodiment, the variable delay component 140 is placed on the electrical connection connecting the second piece of equipment EQ2 to an antenna A2.

Advantageously, the placement of the variable delay component 140 between a piece of equipment and the antenna to which it is connected enables a delay to be introduced on the antenna path. It turns out to be particularly useful when the antenna path is more quickly travelled than the compensation circuit 200. For example, this placement of the variable delay component 140 is particularly advantageous when both pieces of equipment EQ1 and EQ2 use the same antenna.

The invention claimed is:

1. A delay circuit for time offsetting an input radiofrequency signal, said delay circuit comprising: an all-pass filter having a given central frequency configured to linearize a phase-shift of an output signal relative to the input signal as a function of the frequency on a first frequency range; a first antiresonant circuit having a first central frequency and a second antiresonant circuit having a second central frequency, the all-pass filter and the first and second antiresonant circuits being configured and arranged to linearize the phase-shift of the output signal relative to the input signal as a function of the frequency on a second frequency range including the first range, the difference between the first and the second central frequency being less than 30% of the value of one of both frequencies, the difference between the first central frequency and the given central frequency of the all-pass filter being less than 30% of the value of a highest frequency between the first central frequency and the given central frequency, wherein the all-pass filter is a circuit comprising at least one stopper circuit formed by a first inductor associated in parallel with a first capacitor, a second capacitor, a third capacitor and a fourth capacitor, said stopper circuit having a cut-off frequency, the all-pass filter further comprising a resonant circuit formed by a fifth capacitor associated in series with a second inductor, said resonating circuit having a resonance frequency, the cut-off frequency and resonance frequency differing by less than 20% of the value of one of both frequencies.

2. A delay circuit for time offsetting an input radiofrequency signal, said delay circuit comprising: an all-pass filter having a given central frequency configured to linearize a phase-shift of an output signal relative to the input signal as a function of the frequency on a first frequency range; a first antiresonant circuit having a first central frequency and a second antiresonant circuit having a second central frequency, the all-pass filter and the first and second antiresonant circuits being configured and arranged to linearize the phase-shift of the output signal relative to the input signal as a function of the frequency on a second frequency range including the first range, the difference between the first and the second central frequency being less than 30% of the value of one of both frequencies, the difference between the first central frequency and the given central frequency of the all-pass filter being less than 30% of the value of a highest frequency between the first central frequency and the given central frequency, wherein each of the first and second antiresonant circuits is formed by a capacitance associated in parallel with an inductor.

3. A delay line for introducing a variable delay in an output signal, comprising a cascading of a plurality of delay circuits, each delay circuit:
comprising an all-pass filter having a given central frequency configured to linearize a phase-shift of the output signal relative to an input signal as a function of the frequency on a first frequency range;
further comprising a first antiresonant circuit having a first central frequency and a second antiresonant circuit having a second central frequency, the all-pass filter and the first and second antiresonant circuits being configured and arranged to linearize the phase-shift of the output signal relative to the input signal as a function of the frequency on a second frequency range including the first range, the difference between the first and the second central frequency being less than 30% of the value of one of both frequencies, the difference between the first central frequency and the given central frequency of the all-pass filter being less than 30% of the value of a highest frequency between the first central frequency and the given central frequency;
introducing a given multiple of a base delay; and
being associated with a switch to activate or deactivate the delay circuit,
a delay parameterising component being configured to introduce a given delay by activating/deactivating a sub-assembly of the switches of the delay line.

4. A device for reducing interference between a first piece of radio equipment including at least one transmitter and a second piece of radio equipment including at least one receiver, said device comprising:
a first coupler configured to sample a part of the signal transmitted by the first piece of radio equipment;
a processing circuit for processing the sampled signal part delivering a modified signal, said processing circuit including a variable delay component comprising at least one delay circuit, introducing a time offset to the sampled signal;
a second coupler configured to sum the modified signal to the signal received by the second piece of equipment, said signal being a sum signal,
wherein said at least one delay circuit is configured to time offset an input radiofrequency signal and includes an all-pass filter having a given central frequency configured to linearize a phase-shift of an output signal relative to the input signal as a function of the frequency on a first frequency range; a first antiresonant circuit having a first central frequency and a second antiresonant circuit having a second central frequency, the all-pass filter and the first and second antiresonant circuits being configured and arranged to linearize the phase-shift of the output signal relative to the input signal as a function of the frequency on a second frequency range including the first range, the difference between the first and the second central frequency being less than 30% of the value of one of both frequencies, the difference between the first central frequency and the given central frequency of the all-pass filter being less than 30% of the value of a highest frequency between the first central frequency and the given central frequency.

5. The device according to claim 4, wherein the processing circuit comprises a variable phase-shifter modifying a phase of the signal sampled by the first coupler and a variable gain modifying an amplitude of the signal sampled by the first coupler.

6. The device according to claim 4, wherein the variable delay component includes:
a first circuit including the at least one delay circuit introducing a fixed delay;
a second circuit arranged in series with the first circuit including at least one delay line introducing a first stepped parameterisable delay; and
a third circuit arranged in series with the first and second circuits introducing a second parameterisable delay.

7. The device according to claim 4, further comprising:
a coupler configured to sample a part of the sum signal and transmit the rest of the sum signal to the second piece of equipment;
a piece of equipment for characterising the sum signal;
a piece of control equipment configured to receive the signal from the piece of equipment for characterising the sum signal and to control the pieces of equipment for modifying properties of the sampled signal.

8. The device according to claim 7, wherein the piece of control equipment contains a memory for recording the parameters of a phase-shifter, a variable gain and a delay.

9. The device according to claim 4, wherein the first piece of radio equipment and the second piece of radio equipment are the same piece of equipment.

10. The device according to claim 4, wherein the first piece of radio equipment and the second piece of radio equipment use a same antenna.

11. The device according to claim 4, wherein the first and second couplers are radiofrequency couplers or asymmetric power dividers.

12. The device according to claim 4, wherein the variable delay component is placed on an electrical connection connecting the first piece of equipment to an antenna.

13. The device according to claim 4, wherein the variable delay component is placed on an electrical connection connecting the second piece of equipment to an antenna.

\* \* \* \* \*